(12) United States Patent
Hu

(10) Patent No.: US 12,171,134 B2
(45) Date of Patent: Dec. 17, 2024

(54) DISPLAY PANEL, AND DISPLAY DEVICE

(71) Applicant: Wuhan China Star Optoelectronics Semiconductor Display Technology Co., Ltd., Wuhan (CN)

(72) Inventor: Kai Hu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/620,831

(22) PCT Filed: Nov. 12, 2021

(86) PCT No.: PCT/CN2021/130374
§ 371 (c)(1),
(2) Date: Dec. 20, 2021

(87) PCT Pub. No.: WO2023/077549
PCT Pub. Date: May 11, 2023

(65) Prior Publication Data
US 2024/0032385 A1    Jan. 25, 2024

(30) Foreign Application Priority Data
Nov. 5, 2021   (CN) ............................ 20111305589.2

(51) Int. Cl.
*H01L 27/14*     (2006.01)
*H10K 59/123*   (2023.01)
(Continued)

(52) U.S. Cl.
CPC ..... *H10K 59/80516* (2023.02); *H10K 59/123* (2023.02); *H10K 59/124* (2023.02);
(Continued)

(58) Field of Classification Search
CPC ........... H10K 59/80516; H10K 59/123; H10K 59/124; H10K 59/38; H10K 59/40;
(Continued)

(56) References Cited

U.S. PATENT DOCUMENTS 11,894,506 B2 *   2/2024   Lee .......................... H01L 33/58
2018/0122890 A1   5/2018   Park et al.

FOREIGN PATENT DOCUMENTS

CN      107452773 A   12/2017
CN      109935622 A    6/2019
(Continued)

*Primary Examiner* — Tan N Tran
(74) *Attorney, Agent, or Firm* — PV IP PC; Wei Te Chung

(57) ABSTRACT

A display panel and a display device are provided. The display panel comprises a substrate, a source and drain metal layer, a first planarization layer, an auxiliary metal layer, a second planarization layer, an anode and a light emitting pixel. The anode comprises a first anode part corresponding to the light emitting pixel. By removing the auxiliary metal layer directly below the first anode part, the orthographic projection of the auxiliary metal layer on the substrate is outside the orthographic projection of the first anode part on the substrate, which helps to eliminate horizontal diffraction fringes.

16 Claims, 2 Drawing Sheets

(51) Int. Cl.
  *H10K 59/124* (2023.01)
  *H10K 59/38* (2023.01)
  *H10K 59/40* (2023.01)
  *H10K 59/80* (2023.01)

(52) U.S. Cl.
  CPC ............. *H10K 59/38* (2023.02); *H10K 59/40* (2023.02); *H10K 59/873* (2023.02); *H10K 59/8792* (2023.02)

(58) Field of Classification Search
  CPC ............. H10K 59/873; H10K 59/8792; H10K 2102/3026; H10K 59/131; H10K 59/1213; H10K 50/814; H10K 50/813
  USPC ...................................................... 257/59, 72
  See application file for complete search history.

(56) References Cited

FOREIGN PATENT DOCUMENTS

| | | | |
|---|---|---|---|
| CN | 110459568 A | * | 11/2019 |
| CN | 110610980 A | | 12/2019 |
| CN | 111725281 A | | 9/2020 |
| CN | 112820763 A | | 5/2021 |
| CN | 112993194 A | | 6/2021 |
| CN | 113035903 A | | 6/2021 |
| CN | 113394244 A | | 9/2021 |
| CN | 113540199 A | | 10/2021 |

\* cited by examiner

DISPLAY PANEL, AND DISPLAY DEVICE

FIELD OF THE INVENTION

The present application relates to a display field, and more particularly to a display panel and a display device.

BACKGROUND OF THE INVENTION

Active-matrix organic light-emitting diode (AMOLED) display panels are favored by people because of their wide viewing angle, ultra-high contrast, and fast response. However, in AMOLED display panels, the source and drain metal layer is usually arranged directly below the anode, resulting in uneven surface of the anode and reduced flatness of the anode, thereby causing the display panel to show strong horizontal diffraction fringes.

The embodiment of the present application provides a display panel and a display device to solve the technical problem that the conventional display panel and the display device arrange the source and drain metal layer disposed under the anode, which causes the surface of the anode to be convex and uneven, thereby generating horizontal diffraction fringes.

SUMMARY OF THE INVENTION

To solve the aforesaid problem, the technical solution of the present application is described as follows:

The present application provides a display panel, comprising:
  a substrate;
  a source and drain metal layer disposed at one side of the substrate;
  a first planarization layer covering the source and drain metal layer;
  an auxiliary metal layer disposed on a side of the first planarization layer away from the substrate, wherein the auxiliary metal layer and the source and drain metal layer together form a double-layer source and drain metal layer structure;
  a second planarization layer covering the auxiliary metal layer;
  an anode disposed at a side of the second planarization layer away from the substrate, wherein the auxiliary metal layer penetrates the first planarization layer and is electrically connected to the source and drain metal layer through a first via hole, and the anode penetrates the second planarization layer and is electrically connected to the auxiliary metal layer through a second via hole; and
  a light emitting layer, disposed at a side of the anode away from the substrate, comprising a plurality of light emitting pixels;
  wherein the anode comprises a first anode part corresponding to the light emitting pixel, and an orthographic projection of the auxiliary metal layer on the substrate is outside an orthographic projection of the first anode part on the substrate.

According to the display panel provided by the present application, the auxiliary metal layer comprises a plurality of first lines and a plurality of second lines connected to one another, and the first lines extend along a first direction and the second lines extend along a second direction, and the first direction is different from the second direction;
  an orthographic projection of the first line and an orthographic projection of the second line on the substrate are both outside the orthographic projection of the first anode part on the substrate.

According to the display panel provided by the present application, the first lines are disconnected at a position corresponding to the light emitting pixel to form a plurality of notches, and the second planarization layer fills the notches, and there is a gap between an edge of the orthographic projection of the notch on the substrate and an edge of the orthographic projection of the first anode part on the substrate.

According to the display panel provided by the present application, a size of the gap in the first direction is greater than or equal to 3 micrometers.

According to the display panel provided by the present application, the first line comprises a plurality of first connecting parts and a plurality of second connecting parts, and two adjacent first connecting parts are electrically connected through a corresponding second connecting part, and the first connecting part extends along the first direction, and an orthographic projection of the second connecting part on the substrate bypasses one side of the orthographic projection of the first anode part on the substrate and the second connecting part is electrically connected to the first connecting part.

According to the display panel provided by the present application, the source and drain metal layer comprises a plurality of third lines disposed along the first direction, and the second line is electrically connected to the source and drain metal layer of the corresponding third line through the second via hole.

According to the display panel provided by the present application, an orthographic projection of the first line on the substrate and an orthographic projection of the third line on the substrate are at least partially overlapped.

According to the display panel provided by the present application, the orthographic projection of the auxiliary metal layer on the substrate is located between the orthographic projections of the adjacent first anode parts on the substrate, and is not overlapped with the orthographic projections of the first anode parts on the substrate.

According to the display panel provided by the present application, the anode further comprises a second anode part, and the second anode part is electrically connected to the auxiliary metal layer through the first via hole.

The present application provides a display panel, comprising:
  a substrate;
  a source and drain metal layer disposed at one side of the substrate;
  a first planarization layer covering the source and drain metal layer;
  an auxiliary metal layer disposed on a side of the first planarization layer away from the substrate;
  a second planarization layer covering the auxiliary metal layer;
  an anode disposed at a side of the second planarization layer away from the substrate, wherein the auxiliary metal layer penetrates the first planarization layer and is electrically connected to the source and drain metal layer through a first via hole, and the anode penetrates the second planarization layer and is electrically connected to the auxiliary metal layer through a second via hole; and
  a light emitting layer disposed at a side of the anode away from the substrate, comprising a plurality of light emitting pixels;

wherein the anode comprises a first anode part corresponding to the light emitting pixel, and an orthographic projection of the auxiliary metal layer on the substrate is outside an orthographic projection of the first anode part on the substrate.

According to the display panel provided by the present application, the auxiliary metal layer comprises a plurality of first lines and a plurality of second lines connected to one another, and the first lines extend along a first direction and the second lines extend along a second direction, and the first direction is different from the second direction;

an orthographic projection of the first line and an orthographic projection of the second line on the substrate are both outside the orthographic projection of the first anode part on the substrate.

According to the display panel provided by the present application, the first lines are disconnected at a position corresponding to the light emitting pixel to form a plurality of notches, and the second planarization layer fills the notches, and there is a gap between an edge of the orthographic projection of the notch on the substrate and an edge of the orthographic projection of the first anode part on the substrate.

According to the display panel provided by the present application, a size of the gap in the first direction is greater than or equal to 3 micrometers.

According to the display panel provided by the present application, the first line comprises a plurality of first connecting parts and a plurality of second connecting parts, and two adjacent first connecting parts are electrically connected through a corresponding second connecting part, and the first connecting part extends along the first direction, and an orthographic projection of the second connecting part on the substrate bypasses one side of the orthographic projection of the first anode part on the substrate and the second connecting part is electrically connected to the first connecting part.

According to the display panel provided by the present application, the source and drain metal layer comprises a plurality of third lines disposed along the first direction, and the second line is electrically connected to the source and drain metal layer of the corresponding third line through the second via hole.

According to the display panel provided by the present application, an orthographic projection of the first line on the substrate and an orthographic projection of the third line on the substrate are at least partially overlapped.

According to the display panel provided by the present application, the orthographic projection of the auxiliary metal layer on the substrate is located between the orthographic projections of the adjacent first anode parts on the substrate, and is not overlapped with the orthographic projections of the first anode parts on the substrate.

According to the display panel provided by the present application, the anode further comprises a second anode part, and the second anode part is electrically connected to the auxiliary metal layer through the first via hole.

According to the display panel provided by the present application, the display panel further comprises:

an encapsulation layer disposed on a side of the light emitting pixel away from the substrate;
a touch layer disposed on a side of the encapsulation layer away from the substrate; and
a color filter layer disposed on a side of the touch layer away from the substrate, wherein the color filter layer comprises a plurality of color resistors and a black matrix disposed between two adjacent color resistors.

The present invention provides a display device, comprising a display panel, and the display panel comprises:
a substrate;
a source and drain metal layer disposed at one side of the substrate;
a first planarization layer covering the source and drain metal layer;
an auxiliary metal layer disposed on a side of the first planarization layer away from the substrate;
a second planarization layer covering the auxiliary metal layer;
an anode disposed at a side of the second planarization layer away from the substrate, wherein the auxiliary metal layer penetrates the first planarization layer and is electrically connected to the source and drain metal layer through a first via hole, and the anode penetrates the second planarization layer and is electrically connected to the auxiliary metal layer through a second via hole; and
a light emitting layer, disposed at a side of the anode away from the substrate, comprising a plurality of light emitting pixels;
wherein the anode comprises a first anode part corresponding to the light emitting pixel, and an orthographic projection of the auxiliary metal layer on the substrate is outside an orthographic projection of the first anode part on the substrate.

The benefits of the present application are: in the display panel and display device provided by the present application, the auxiliary metal layer directly below the first anode part corresponding to the light emitting pixel is removed, so that the orthographic projection of the auxiliary metal layer on the substrate is outside the orthographic projection of the first anode part on the substrate. Therefore, the second planarization layer does not need to planarize the auxiliary metal layer directly under the first anode part. Thus, at least two planarization layers (the first planarization layer and the second planarization layer) planarize the source and drain metal layer, thereby improving the flatness of the surface of the first anode part. On one hand, it helps to eliminate horizontal diffraction fringes; on the other hand, it is beneficial to improve the light emitting efficiency of the light emitting pixel and to improve the white light color shift of large viewing angle.

BRIEF DESCRIPTION OF THE DRAWINGS

In order to more clearly illustrate the embodiments of the present application and the prior art, the following figures will be described in the embodiments and the prior art are briefly introduced. It is obvious that the drawings are only some embodiments of the present application, those of ordinary skill in this field can obtain other figures according to these figures without paying the premise.

Figure 1:
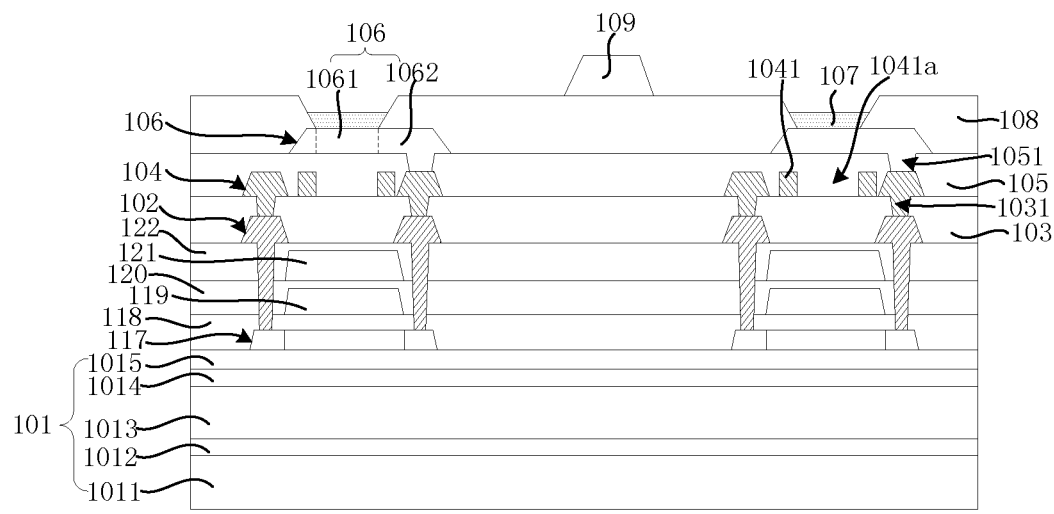
FIG. 1 is a diagram of a cross-sectional structure of a display panel provided by an embodiment of the present application.

REFERENCE NUMERALS 101. substrate; 102. source and drain metal layer; 1021. third line; 103. first planarization layer; In 1031. first via hole; 104. auxiliary metal layer; 105. second planarization layer; 1051. second via hole; 106. anode; 1061. first anode part; 1062. second anode part; 107. light emitting pixel; 1071. red light emitting unit; 1072. green light emitting unit; 1073. blue light emitting unit; 108. pixel defining layer; 109. support column; 110. encapsulation layer; 111. touch layer; 112. color filter layer; 1121. color resistor; 1122. black matrix; 113. third planarization layer; 115. adhesive layer; 116. cover plate;

1041. first line; 1041a. gap; 1041b. first connecting part; 1041c. second connecting part; 1042. second line; 1042a. straight line part; 1042b. curve line part;

1011. first substrate; 1012. first barrier layer; 1013. second substrate; 1014. second barrier layer; 1015. buffer layer;

117. semiconductor layer; 118. first gate insulating layer; 119. first gate layer; 120. second gate insulating layer; 121. second gate layer; 122. interlayer dielectric layer.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of skilled in the premise of no creative efforts obtained, should be considered within the scope of protection of the present application. Besides, it should be understood that the specific embodiments described herein are merely for illustrating and explaining the present application and are not intended to limit the present application. In this application, if no explanation is made to the contrary, the orientation words used such as "upper" and "lower" usually refer to the upper and lower of the device in actual use or working state, which specifically are the directions of the drawing in the figures; and "inner" and "outer" refer to the outline of the device.

Figure 2:
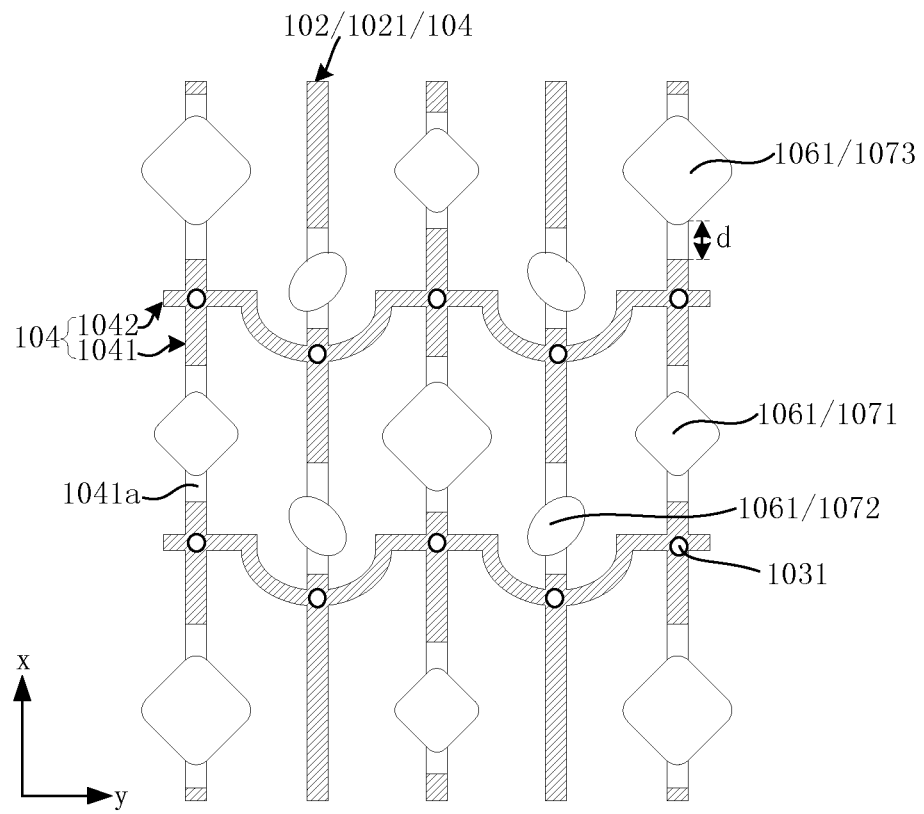
FIG. 2 is a diagram of a partial plane structure of a display panel provided by an embodiment of the present application.

Referring to FIG. 1 and FIG. 2, FIG. 1 is a diagram of a cross-sectional structure of a display panel provided by an embodiment of the present application; FIG. 2 is a diagram of a partial plane structure of a display panel provided by an embodiment of the present application; The embodiment of the present application provides a display panel. The display panel comprises a substrate 101, a source and drain metal layer 102, a first planarization layer 103, an auxiliary metal layer 104, a second planarization layer 105, an anode 106 and a light emitting layer.

The source and drain metal layer 102 is disposed at one side of the substrate 101. The first planarization layer 103 covers the source and drain metal layer 102. The auxiliary metal layer 104 is disposed on a side of the first planarization layer 103 away from the substrate 101. The second planarization layer 105 covers the auxiliary metal layer 104. The anode 106 is disposed at a side of the second planarization layer 105 away from the substrate 101. The auxiliary metal layer 104 penetrates the first planarization layer 103 and is electrically connected to the source and drain metal layer 102 through a first via hole 1031. The anode 106 penetrates the second planarization layer 105 and is electrically connected to the auxiliary metal layer 104 through a second via hole 1051. The light emitting pixels 107 are disposed at a side of the anode 106 away from the substrate 101. The light emitting layer is disposed at a side of the anode 106 away from the substrate 101, and the light emitting layer comprises a plurality of light emitting pixels 107.

The anode 106 comprises a first anode part 1061 corresponding to the light emitting pixel 107. An orthographic projection of the auxiliary metal layer 104 on the substrate 101 is outside an orthographic projection of the first anode part 1061 on the substrate 101 to remove the auxiliary metal layer 104 under the first anode part 1061. Namely, after the auxiliary metal layer 104 is removed, There are two planarization layers under the first anode part 1061. That is, the presence of the first planarization layer 103 and the second planarization layer 105 under the first anode part 1061 together planarize the source and drain metal layer 102, thereby improving the flatness of the surface of the first anode part 1061. On one hand, it helps to eliminate horizontal diffraction fringes; on the other hand, it is beneficial to improve the light emitting efficiency of the light emitting pixel 107 and to improve the white light color shift of large viewing angle.

It should be noted that, in one embodiment, the auxiliary metal layer 104 in the present application may also be a source and drain metal layer. Under such circumstance, the source and drain metal layer in the lower layer is electrically connected to the auxiliary metal layer 104 in the upper layer to form a double-layer source and drain metal layer structure to reduce the impedance of the display panel to ensure that the display panel possesses a lower voltage drop.

Optionally, the auxiliary metal layer 104 and the source and drain metal layer 102 may employ the same material.

In another embodiment, the auxiliary metal layer 104 in the present application may be a transparent connecting line, which is employed to electrically connect the source and drain metal layer 102 and the anode 106, so that the pixel driving unit drives the light emitting pixel 107 to emit light. Compared with the design of the prior art in which the source and drain metal layer 102 is directly electrically connected to the anode 106, it is beneficial to improve the light transmittance of the display panel, and can be applied to an under-screen camera display panel.

It should be noted that the auxiliary metal layer in the present application may have one, two, three or even more layers, and the present application is not limited thereto.

Specifically, the light emitting pixel 107 comprises at least a red light emitting unit 1071, a green light emitting unit 1072 and a blue light emitting unit 1073. In the embodiment of the present application, the red light emitting unit 1071 and the blue light emitting unit 1073 are located on a straight line. The green light emitting unit 1072 is located in a space enclosed by the two red light emitting units 1071 and the two green light emitting units 1072.

The display panel further comprises a pixel defining layer 108 and a support column 109, and the pixel defining layer 108 defines a plurality of pixel openings. The light emitting pixel 107 is located inside the pixel opening. The support column 109 is located on a side of the pixel defining layer 108 away from the substrate 101.

Specifically, the auxiliary metal layer 104 comprises a first line 1041 and a second line 1042 connected to each other, and the first line 1041 extends along a first direction x and the second line extends along a second direction 1042, and the first direction x is different from the second direction y; the orthographic projection of the first line 1041 on the substrate 101 is overlapped with the orthographic projection of the source and drain metal layer 102 on the substrate 101, and the orthographic projection of the first line 1041 on the substrate 101 is outside the orthographic projection of the first anode part 1061 on the substrate 101.

Optionally, in this embodiment of the present application, the first direction x is perpendicular to the second direction y. Specifically, the first line 1041 extends in a vertical direction, the second line 1042 extends in a horizontal direction, and the second line 1042 is a wave-shaped line. The second line 1042 comprises a straight line part 1042a and a curve line part 1042b. The curve line part 1042b bypasses the green light emitting unit 1072 and the first anode part 1061 connected to the green light emitting unit 1072, so as to prevent the surface flatness of the first anode part 1061 from being reduced; the straight line part 1042a intersects the first line 1041, so that the first line 1041 and the second line 1042 are electrically connected, and the first line 1041 and the second line 1042 intersect to form a mesh structure, so that the voltage of each light emitting unit in the horizontal direction and the vertical direction is kept equal, which is beneficial to further improve the uniformity of the display panel at all positions.

Furthermore, the first lines 1041 are disconnected at a position corresponding to the light emitting pixel 107 to form a plurality of notches 1041a, and the second planarization layer 105 fills the notches 1041a, and there is a gap between an edge of the orthographic projection of the notch 1041a on the substrate 101 and an edge of the orthographic projection of the first anode part 1061 on the substrate 101, in order to prevent the first anode part 1061 from being affected by the first line 1041, resulting in formation of a slope near the notch 1041a to cause the undesirable situation that the surface flatness of the first anode part 1061 is reduced.

Specifically, a size of the gap in the first direction x is greater than or equal to a width of the first line 1041.

Specifically, a size of the gap in the first direction is greater than or equal to 3 micrometers.

Figure 3:
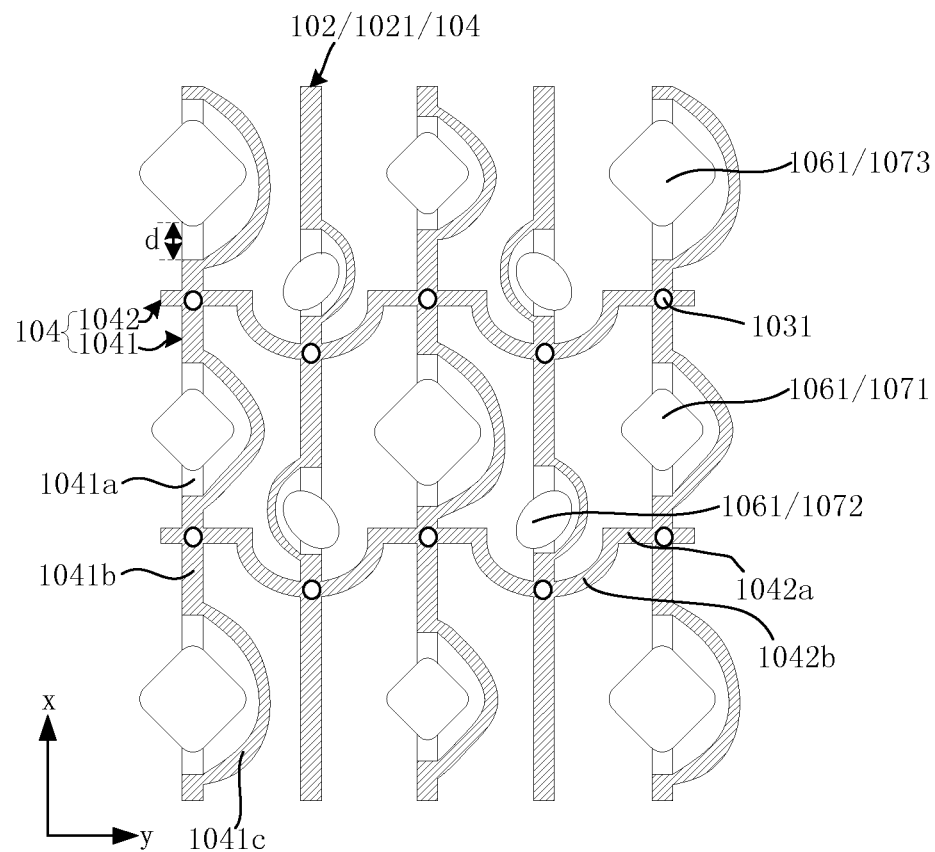
FIG. 3 is a diagram of a partial plane structure of another display panel provided by an embodiment of the present application.

In another embodiment, referring to FIG. 3, FIG. 3 is a diagram of a partial plane structure of another display panel provided by an embodiment of the present application. The difference between FIG. 3 and FIG. 2 is that the first line 1041 comprises a plurality of first connecting parts 1041b and a plurality of second connecting parts 1041c, and two adjacent first connecting parts 1041b are electrically connected through a corresponding second connecting part 1041c, and the first connecting part 1041b extends along the first direction x, and an orthographic projection of the second connecting part 1041c on the substrate 101 bypasses one side of the orthographic projection of the first anode part 1061 on the substrate 101 and the second connecting part is electrically connected to the straight line part 1042a.

Understandably, the notch 1041a is formed between two adjacent first connecting parts 1041b, and two ends of the notch 1041a are respectively connected to the two ends of the second connecting part 1041c. Compared with the design of disconnecting the auxiliary metal layer 104 under the first anode part 1061, the auxiliary metal layer 104 under the first anode part 1061 is not disconnected, but is transferred to one side of the first anode part 1061 in this embodiment. The advantage of adopting this design is that since the first line 1041 is not disconnected, the uniformity of the display panel is not significantly reduced, so that the uniformity of the display panel is better.

Specifically, the second connecting part 1041c may be curved, and the orthographic projection of the second connecting part 1041c on the substrate 101 half surrounds the orthographic projection of the first anode part 1061 on the substrate 101 to reduce the space occupied by the second connecting part 1041c, which is beneficial to improve the light transmittance of the display panel.

Specifically, adopting this design needs to reserve enough space for the placement of the second connecting part 1041c, and the arrangement of other film layers or lines can be improved and designed, which will not be described in detail here.

Specifically, the source and drain metal layer 102 comprises a plurality of third lines 1021 disposed along the first direction x, and the second line 1042 is electrically connected to the corresponding third line 1021 through the second via hole 1051, wherein the second via hole 1051 is located at an intersection of the first line 1041 and the second line 1042.

Specifically, an orthographic projection of the first line 1041 on the substrate 101 and an orthographic projection of the third line 1021 on the substrate 101 are at least partially overlapped.

Furthermore, the anode 106 further comprises a second anode part 1062, and the second anode part 1062 is electrically connected to the auxiliary metal layer 104 through the first via hole 1031. Specifically, the second anode part 1062 is arranged around the first anode part 1061.

Figure 4:
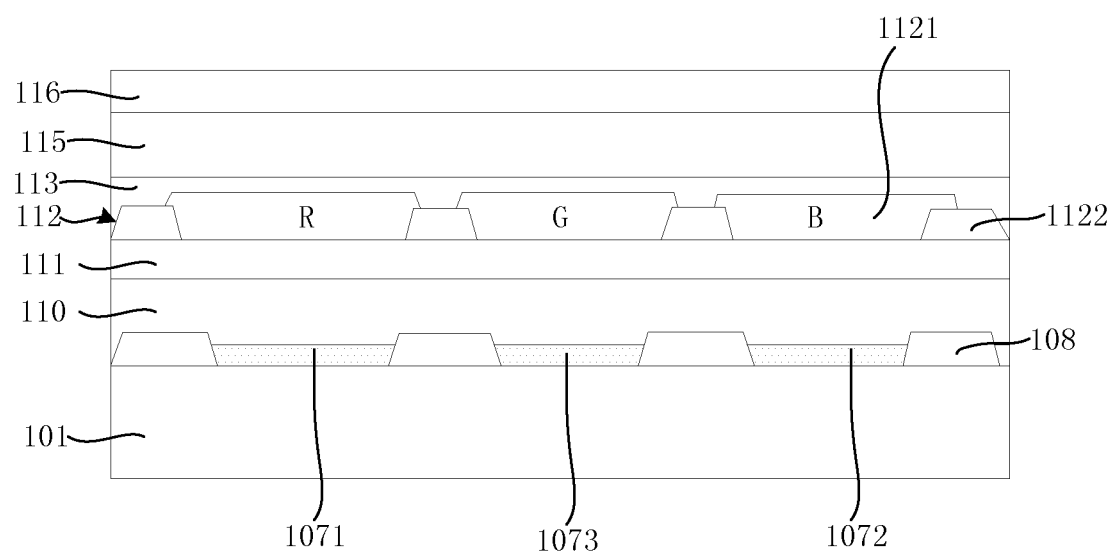
FIG. 4 is a diagram of a cross-sectional structure of another display panel provided by an embodiment of the present application.

Referring to FIG. 4, FIG. 4 is a diagram of a cross-sectional structure of another display panel provided by an embodiment of the present application; in one embodiment, the display panel further comprises an encapsulation layer 110, a touch layer 111 and a color filter layer 112. The encapsulation layer 110 is disposed on a side of the light emitting pixel 107 away from the substrate 101. The touch layer 111 is disposed on a side of the encapsulation layer 110 away from the substrate 101. The color filter layer 112 is disposed on a side of the touch layer 111 away from the substrate 101. The color filter layer 112 comprises a plurality of color resistors 1121 and a black matrix 1122 disposed between two adjacent color resistors 1121.

Understandably, the display panel employs the color filter layer 112 instead of the polarizer. Since the polarizer has a strong inhibitory effect on reflection, the display panel in this embodiment eliminates the polarizer, which results in the appearance of more obvious horizontal diffraction fringes due to the low surface flatness of the anode 106. Therefore, the present application adopts the design of removing the auxiliary metal layer 104 directly under the first anode part 1061, which greatly improves the defects of the horizontal diffraction fringes.

In addition, the increase in the transmittance of the display panel is beneficial to improve the overall uniformity of the display panel, so as to meet the uniformity requirements of the display panel.

Furthermore, the display panel further comprises a third planarization layer 113, an adhesive layer 115 and a cover plate 116, and the third planarization layer 113 is disposed on a side of the color filter layer 112 away from the substrate 101 for planarizing the color filter layer 112; the cover plate 116 is disposed on a side of the third planarization layer 113 away from the substrate 101; the adhesive layer 115 is disposed between the cover plate 116 and the third planarization layer 113 for bonding the cover plate 116 and the third planarization layer 113.

Furthermore, continue referring to FIG. 1. The substrate 101 comprises a first substrate 1011, a first barrier layer 1012, a second substrate 1013, a second barrier layer 1014 and a buffer layer 1015. The first barrier layer 1012 is disposed on a side of the first substrate 1011. The second substrate 1013 is disposed on a side of the first barrier layer 1012 away from the first substrate 1011. The second barrier layer 1014 is disposed on a side of the second substrate 1013 away from the first substrate 1011. The buffer layer 1015 is disposed on a side of the second barrier layer 1014 away from the first substrate 1011.

Specifically, the display panel further comprises a semiconductor layer 117, a first gate insulating layer 118, a first gate layer 119, a second gate insulating layer 120, a second gate layer 121 and an interlayer dielectric layer 122; The semiconductor layer 117 comprises a source region, a drain region and a channel region located between the source region and the drain region. The source and drain metal layer 102 comprises a source electrode and a drain electrode. The source electrode is electrically connected to the source electrode region through a via hole penetrating the interlayer dielectric layer 122, the second gate insulating layer 120 and the first gate insulating layer 118. The drain electrode is electrically connected to the drain region through a via hole penetrating the interlayer dielectric layer 122, the second gate insulating layer 120 and the first gate insulating layer 118.

The embodiment of the present application further provides a display device. The display device comprises the display panel in the aforesaid embodiment. The display device comprises, but is not limited to, mobile phones, tablet computers, computer monitors, game consoles, display screens, televisions, wearable devices and other household appliances with display functions.

The benefits are: in the display panel and display device provided by the embodiment of the present application, the auxiliary metal layer directly below the first anode part corresponding to the light emitting pixel is removed, so that the orthographic projection of the auxiliary metal layer on the substrate is outside the orthographic projection of the first anode part on the substrate. Therefore, the second planarization layer does not need to planarize the auxiliary metal layer directly under the first anode part. Thus, at least two planarization layers (the first planarization layer and the second planarization layer) planarize the source and drain metal layer, thereby improving the flatness of the surface of the first anode part. On one hand, it helps to eliminate horizontal diffraction fringes; on the other hand, it is beneficial to improve the light emitting efficiency of the light emitting pixel and to improve the white light color shift of large viewing angle.

In summary, although the above preferred embodiments of the present application are disclosed, the foregoing preferred embodiments are not intended to limit the invention, those skilled in the art can make various kinds of alterations and modifications without departing from the spirit and scope of the present application. Thus, the scope of protection of the present application is defined by the scope of the claims.

What is claimed is:

1. A display panel, comprising:
a substrate;
a source and drain metal layer disposed at one side of the substrate;
a first planarization layer covering the source and drain metal layer;
an auxiliary metal layer disposed on a side of the first planarization layer away from the substrate, wherein the auxiliary metal layer and the source and drain metal layer together form a double-layer source and drain metal layer structure;
a second planarization layer covering the auxiliary metal layer;
an anode disposed at a side of the second planarization layer away from the substrate, wherein the auxiliary metal layer penetrates the first planarization layer and is electrically connected to the source and drain metal layer through a first via hole, and the anode penetrates the second planarization layer and is electrically connected to the auxiliary metal layer through a second via hole; and
a light emitting layer disposed at a side of the anode away from the substrate, comprising a plurality of light emitting pixels;
wherein the anode comprises a first anode part corresponding to the light emitting pixel, and an orthographic projection of the auxiliary metal layer on the substrate is outside an orthographic projection of the first anode part on the substrate;
wherein the auxiliary metal layer comprises a plurality of first lines and a plurality of second lines connected to one another, and the first lines extend along a first direction and the second lines extend along a second direction, and the first direction is different from the second direction;
an orthographic projection of the first line and an orthographic projection of the second line on the substrate are both outside the orthographic projection of the first anode part on the substrate;
wherein the first lines are disconnected at a position corresponding to the light emitting pixel to form a plurality of notches, and the second planarization layer fills the notches, and there is a gap between an edge of the orthographic projection of the notch on the substrate and an edge of the orthographic projection of the first anode part on the substrate.

2. The display panel according to claim 1, wherein a size of the gap in the first direction is greater than or equal to 3 micrometers.

3. The display panel according to claim 1, wherein the first line comprises a plurality of first connecting parts and a plurality of second connecting parts, and two adjacent first connecting parts are electrically connected through a corresponding second connecting part, and the first connecting part extends along the first direction, and an orthographic projection of the second connecting part on the substrate bypasses one side of the orthographic projection of the first anode part on the substrate and the second connecting part is electrically connected to the first connecting part.

4. The display panel according to claim 1, wherein the source and drain metal layer comprises a plurality of third lines disposed along the first direction, and the second line is electrically connected to the source and drain metal layer of the corresponding third line through the second via hole.

5. The display panel according to claim 4, wherein an orthographic projection of the first line on the substrate and an orthographic projection of the third line on the substrate are at least partially overlapped.

6. The display panel according to claim 1, wherein the orthographic projection of the auxiliary metal layer on the substrate is located between the orthographic projections of the adjacent first anode parts on the substrate, and is not overlapped with the orthographic projections of the first anode parts on the substrate.

7. The display panel according to claim 1, wherein the anode further comprises a second anode part, and the second anode part is electrically connected to the auxiliary metal layer through the first via hole.

8. A display panel, comprising:
a substrate;

a source and drain metal layer disposed at one side of the substrate;

a first planarization layer covering the source and drain metal layer;

an auxiliary metal layer disposed on a side of the first planarization layer away from the substrate;

a second planarization layer covering the auxiliary metal layer;

an anode disposed at a side of the second planarization layer away from the substrate, wherein the auxiliary metal layer penetrates the first planarization layer and is electrically connected to the source and drain metal layer through a first via hole, and the anode penetrates the second planarization layer and is electrically connected to the auxiliary metal layer through a second via hole; and a light emitting layer disposed at a side of the anode away from the substrate, comprising a plurality of light emitting pixels;

wherein the anode comprises a first anode part corresponding to the light emitting pixel, and an orthographic projection of the auxiliary metal layer on the substrate is outside an orthographic projection of the first anode part on the substrate;

wherein the auxiliary metal layer comprises a plurality of first lines and a plurality of second lines connected to one another, and the first lines extend along a first direction and the second lines extend along a second direction, and the first direction is different from the second direction;

an orthographic projection of the first line and an orthographic projection of the second line on the substrate are both outside the orthographic projection of the first anode part on the substrate;

wherein the first lines are disconnected at a position corresponding to the light emitting pixel to form a plurality of notches, and the second planarization layer fills the notches, and there is a gap between an edge of the orthographic projection of the notch on the substrate and an edge of the orthographic projection of the first anode part on the substrate.

9. The display panel according to claim 8, wherein a size of the gap in the first direction is greater than or equal to 3 micrometers.

10. The display panel according to claim 8, wherein the first line comprises a plurality of first connecting parts and a plurality of second connecting parts, and two adjacent first connecting parts are electrically connected through a corresponding second connecting part, and the first connecting part extends along the first direction, and an orthographic projection of the second connecting part on the substrate bypasses one side of the orthographic projection of the first anode part on the substrate and the second connecting part is electrically connected to the first connecting part.

11. The display panel according to claim 8, wherein the source and drain metal layer comprises a plurality of third lines disposed along the first direction, and the second line is electrically connected to the source and drain metal layer of the corresponding third line through the second via hole.

12. The display panel according to claim 11, wherein an orthographic projection of the first line on the substrate and an orthographic projection of the third line on the substrate are at least partially overlapped.

13. The display panel according to claim 8, wherein the orthographic projection of the auxiliary metal layer on the substrate is located between the orthographic projections of the adjacent first anode parts on the substrate, and is not overlapped with the orthographic projections of the first anode parts on the substrate.

14. The display panel according to claim 8, wherein the anode further comprises a second anode part, and the second anode part is electrically connected to the auxiliary metal layer through the first via hole.

15. The display panel according to claim 8, wherein the display panel further comprises:

an encapsulation layer disposed on a side of the light emitting pixel away from the substrate;

a touch layer disposed on a side of the encapsulation layer away from the substrate; and a color filter layer disposed on a side of the touch layer away from the substrate, wherein the color filter layer comprises a plurality of color resistors and a black matrix disposed between two adjacent color resistors.

16. A display device, comprising a display panel, wherein the display panel comprises:

a substrate;

a source and drain metal layer disposed at one side of the substrate;

a first planarization layer covering the source and drain metal layer;

an auxiliary metal layer disposed on a side of the first planarization layer away from the substrate;

a second planarization layer covering the auxiliary metal layer;

an anode disposed at a side of the second planarization layer away from the substrate, wherein the auxiliary metal layer penetrates the first planarization layer and is electrically connected to the source and drain metal layer through a first via hole, and the anode penetrates the second planarization layer and is electrically connected to the auxiliary metal layer through a second via hole; and a light emitting layer disposed at a side of the anode away from the substrate, comprising a plurality of light emitting pixels;

wherein the anode comprises a first anode part corresponding to the light emitting pixel, and an orthographic projection of the auxiliary metal layer on the substrate is outside an orthographic projection of the first anode part on the substrate;

wherein the auxiliary metal layer comprises a plurality of first lines and a plurality of second lines connected to one another, and the first lines extend along a first direction and the second lines extend along a second direction, and the first direction is different from the second direction;

an orthographic projection of the first line and an orthographic projection of the second line on the substrate are both outside the orthographic projection of the first anode part on the substrate;

wherein the first lines are disconnected at a position corresponding to the light emitting pixel to form a plurality of notches, and the second planarization layer fills the notches, and there is a gap between an edge of the orthographic projection of the notch on the substrate and an edge of the orthographic projection of the first anode part on the substrate.

* * * * *